(12) United States Patent
Tsuchiya et al.

(10) Patent No.: US 11,513,156 B2
(45) Date of Patent: Nov. 29, 2022

(54) VOLTAGE DETERMINATOR AND VOLTAGE DETERMINATION SYSTEM

(71) Applicant: KEIHIN CORPORATION, Tokyo (JP)

(72) Inventors: Shingo Tsuchiya, Utsunomiya (JP); Seiji Kamata, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 535 days.

(21) Appl. No.: 16/532,664

(22) Filed: Aug. 6, 2019

(65) Prior Publication Data

US 2020/0057112 A1 Feb. 20, 2020

(30) Foreign Application Priority Data

Aug. 16, 2018 (JP) .............................. JP2018-153059

(51) Int. Cl.
| | | |
|---|---|---|
| *G01R 31/3835* | (2019.01) | |
| *H01M 10/42* | (2006.01) | |
| *H01M 10/48* | (2006.01) | |
| *H02J 7/00* | (2006.01) | |

(52) U.S. Cl.
CPC ...... *G01R 31/3835* (2019.01); *H01M 10/425* (2013.01); *H01M 10/4207* (2013.01); *H01M 10/482* (2013.01); *H02J 7/0063* (2013.01); *H01M 2010/4271* (2013.01); *H01M 2010/4278* (2013.01); *H02J 2007/0067* (2013.01)

(58) Field of Classification Search
CPC .......... G01R 31/3835; H01M 10/4207; H01M 10/425; H01M 10/482; H01M 2010/4271; H01M 2010/4278; H02J 2007/0067

USPC ........................................................... 702/63
See application file for complete search history.

(56) References Cited

U.S. PATENT DOCUMENTS

| | | | |
|---|---|---|---|
| 9,438,109 B2* | 9/2016 | Moon ..................... | G05F 1/468 |
| 9,461,496 B1* | 10/2016 | Zhang ................ | H02J 7/00712 |
| 2012/0009445 A1* | 1/2012 | Li ....................... | H01M 10/482 |
| | | | 429/93 |
| 2014/0111215 A1* | 4/2014 | Inukai ..................... | H03K 5/24 |
| | | | 327/83 |
| 2014/0184178 A1* | 7/2014 | Kim ....................... | G05F 1/468 |
| | | | 323/234 |

FOREIGN PATENT DOCUMENTS

| | | |
|---|---|---|
| JP | 2001006750 A | 1/2001 |
| JP | 2002022582 A | 1/2002 |
| JP | 2012251979 A | 12/2012 |
| JP | 2013076602 A | 4/2013 |
| JP | 2014197542 A | 10/2014 |

OTHER PUBLICATIONS

JPO Notice of Reasons for Refusal for corresponding JP Application No. 2018-153059; dated Dec. 14, 2021.
JPO Notice of Reasons for Refusal for corresponding JP Application No. 2018-153059; dated Oct. 25, 2022.

* cited by examiner

*Primary Examiner* — Michael P Nghiem
(74) *Attorney, Agent, or Firm* — Cantor Colburn LLP

(57) ABSTRACT

A voltage determinator which determines a battery voltage using a voltage determination circuit and is configured to output the determination voltage to a corrector in a separate body includes a characteristics signal generation circuit that is configured to output a characteristics signal indicating characteristics of the voltage determination circuit to the corrector.

9 Claims, 4 Drawing Sheets

FIG. 3A

| GAIN CORRECTION VALUE | FIRST SET VOLTAGE |
|---|---|
| 1.50000 | 0.25 |
| 1.49999 | 0.50 |
| ⋮ | ⋮ |
| 1.00001 | 2.25 |
| 1.00000 | 2.50 |
| 0.99999 | 2.75 |
| ⋮ | ⋮ |
| 0.50001 | 4.75 |
| 0.50000 | 5.0 |

FIG. 3B

| OFFSET CORRECTION VALUE | SECOND SET VOLTAGE |
|---|---|
| 5.0000 | 0.25 |
| 4.9999 | 0.50 |
| ⋮ | ⋮ |
| 0.0001 | 2.25 |
| 0.0000 | 2.50 |
| −0.0001 | 2.75 |
| ⋮ | ⋮ |
| −4.9999 | 4.75 |
| −5.0000 | 5.0 |

VOLTAGE DETERMINATOR AND VOLTAGE DETERMINATION SYSTEM

CROSS-REFERENCE TO RELATED APPLICATION

The present application claims priority under 35 U.S.C. § 119 to Japanese Patent Application No. 2018-153059, filed on Aug. 16, 2018, the content of which is incorporated herein by reference.

BACKGROUND OF THE INVENTION

Field of the Invention

The present invention relates to a voltage determinator and a voltage determination system.

Priority is claimed on Japanese Patent Application No. 2018-153059, filed Aug. 16, 2018, the content of which is incorporated herein by reference.

Description of Related Art

Patent Document 1 mentioned below discloses a battery ECU which determines an abnormality of an assembled battery mounted on a hybrid vehicle. The assembled battery described above includes a plurality of battery blocks. The battery ECU includes a plurality of voltage determinators and a corrector. The voltage determinators have a one-to-one correspondence with each of the battery blocks. Each voltage determinator outputs the inter-terminal voltage of a one-to-one corresponding battery block. The corrector described above reads the offset value of each voltage determinator acquired from a non-volatile memory in the battery ECU at the time of inspection such as at a factory shipment. The corrector described above corrects a voltage value output by each voltage determinator on the basis of each read offset value. As a result, a static error component of each voltage determinator can be removed.

Patent Documents

[Patent Document 1] Japanese Unexamined Patent Application, First Publication No. 2001-006750

SUMMARY OF THE INVENTION

In the battery ECU of the background art described above, each voltage determinator and corrector are mounted in the battery ECU. For this reason, the corrector can easily perform correction on an output voltage value of each voltage determinator. However, the background art described above does not disclose a method of correcting an output voltage value of each voltage determinator when each voltage determinator and the corrector are configured in separate bodies.

The present invention has been made in view of the circumstances described above, and an object thereof is to correct a determination voltage of a voltage determinator when the voltage determinator and a corrector are provided in separate bodies.

(1) According to one embodiment of the present invention, there is a voltage determinator which includes a voltage determination circuit configured to determine each inter-terminal voltage of a plurality of battery cells configuring a battery, and output a voltage obtained by amplifying the determined each inter-terminal voltage to a corrector in a separate body as a determination voltage, in which the voltage determination circuit is configured to output a characteristics signal indicating characteristics of the voltage determination circuit to the corrector.

(2) In the voltage determinator of (1) described above, the voltage determination circuit may include a voltage generation circuit configured to generate a DC voltage indicating the characteristics of the voltage determination circuit, and an A/D conversion circuit configured to generate a digital signal of the DC voltage as the characteristics signal by performing an A/D conversion on the DC voltage.

(3) In the voltage determinator of (2) described above, the voltage generation circuit may be a voltage divider circuit which is configured to generate the DC voltage by dividing a predetermined voltage.

(4) In the voltage determinator of any one of (1) to (3) described above, the characteristics of the voltage determination circuit may be at least one of an offset error of the voltage determination circuit and a gain error of the voltage determination circuit.

(5) In the voltage determinator of any one of (1) to (3) described above, the battery may include a plurality of battery modules, each of the battery modules may include the plurality of battery cells, and a plurality of voltage determination circuits may be provided in a one-to-one correspondence with each of the plurality of battery modules in the voltage determinator.

(6) In the voltage determinator of any one of (1) to (5) described above, the characteristics of the voltage determination circuit may be at least one of an offset error of the voltage determination circuit and a gain error of the voltage determination circuit.

(7) According to another embodiment of the present invention, there is a voltage determination system which includes the voltage determinator according to at least one of (1) to (3), and the corrector, in which the corrector corrects the determination voltage on the basis of the characteristics signal input from the voltage determinator.

(8) In the voltage determination system of (7) described above, the characteristics of the voltage determination circuit may be at least one of an offset error of the voltage determination circuit and a gain error of the voltage determination circuit.

(9) In the voltage determination system of (7) described above, the battery may include a plurality of battery modules, each of the battery modules may include the plurality of battery cells, and a plurality of the voltage determination circuits may be provided in a one-to-one correspondence with each of the plurality of battery modules in the voltage determinator.

(10) In the voltage determination system of (8) described above, the battery may include a plurality of battery modules, each of the battery modules may include the plurality of battery cells, and a plurality of the voltage determination circuits may be provided in a one-to-one correspondence with each of the plurality of battery modules in the voltage determinator.

In one embodiment of the present invention, it is possible to correct a determination voltage of a voltage determinator when the voltage determinator and a corrector are provided in separate bodies.

BRIEF DESCRIPTION OF THE DRAWINGS

FIG. 3A-FIG. 3B is a table which shows a relationship between a correction value and a correction voltage in the voltage determinator according to the present embodiment.

DETAILED DESCRIPTION OF THE INVENTION

Hereinafter, the present embodiment will be described with reference to drawings.

Figure 1:
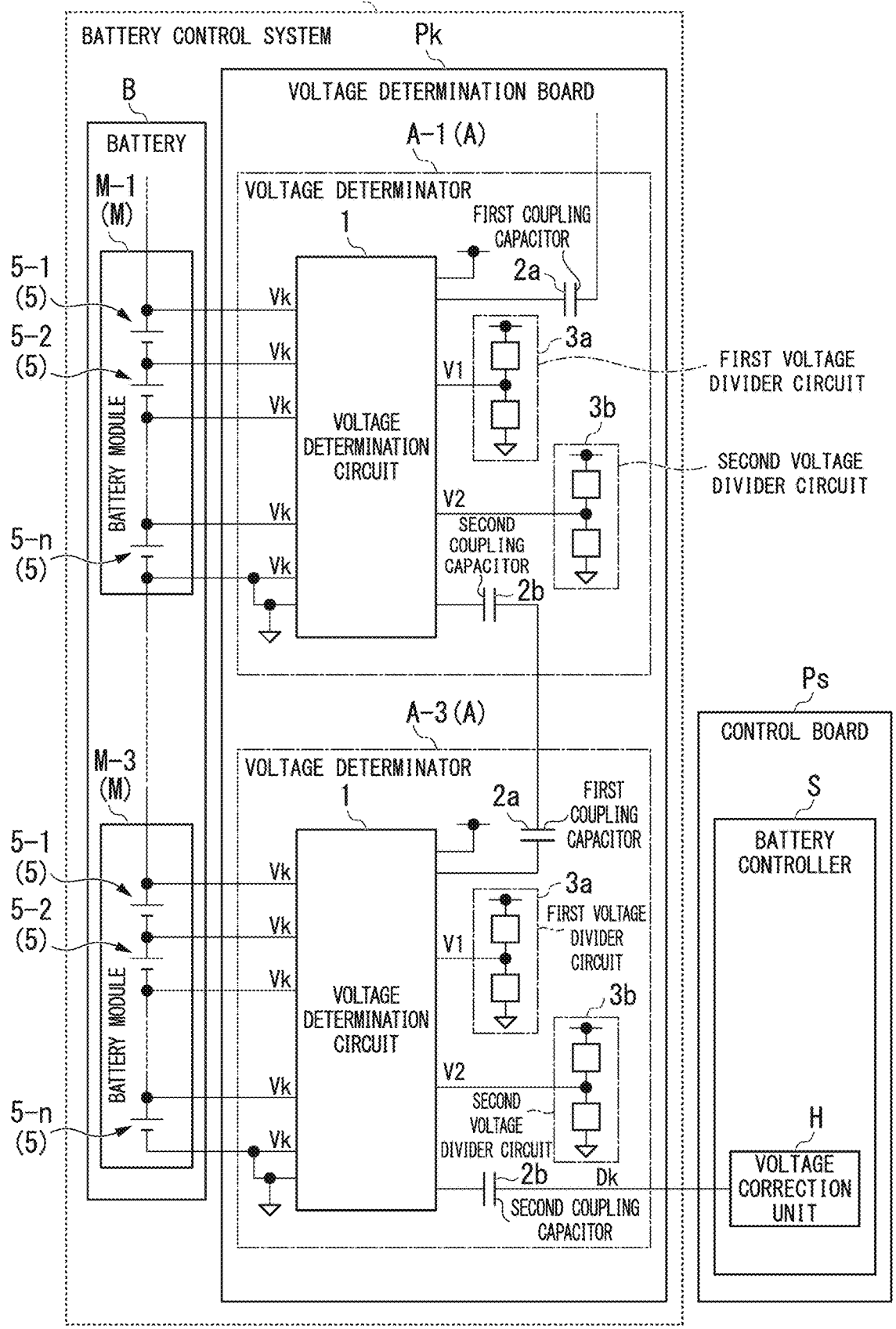
FIG. 1 is a system configuration diagram of a battery control system 100 according to the present embodiment.

As shown in FIG. 1, a battery control system 100 according to the present embodiment includes a plurality of voltage determinators A and a battery controller S. The battery control system 100 is a control system that controls a battery B. The battery control system 100 corresponds to a "voltage determination system" in the present invention. The battery controller S is an example of a "corrector" in the present invention.

As shown in FIG. 1, in the battery B in the present embodiment, a plurality of battery modules M are connected in series. The battery B is, for example, a lithium ion battery mounted on a vehicle. The battery control system 100 according to the present embodiment is mounted on an electric vehicle or a hybrid vehicle. The battery module M includes a predetermined number n of battery cells 5 (5-1 to 5-$n$, where n is an integer of 2 or more) connected to each other in series.

The voltage determinators A are provided in one-to-one correspondence with each battery module M. The voltage determinators A determine an inter-terminal voltage of each of the battery cells 5-1 to 5-$n$ in a one-to-one corresponding battery module M, as a determination voltage Vk. Each voltage determinator A transfers a digital value of the determined determination voltage Vk to the battery controller S as determination data Dk.

For example, the plurality of battery modules M may include battery modules M-1 to M-3. Then, it is assumed that the plurality of battery modules M are connected in series in an order of a battery module M-1, a battery module M-2, and a battery module M-3 toward a negative electrode of the battery B from a positive electrode of the battery B. In this case, the plurality of voltage determinators A include voltage determinators A-1 to A-3. Then, a voltage determinator A-1 one-to-one corresponds to a battery module M-1, and determines the inter-terminal voltage of the battery cells 5-1 to 5-$n$ of the battery module M-1 as a determination voltage Vk. A voltage determinator A-2 one-to-one corresponds to a battery module M-2, and determines the inter-terminal voltage of the battery cells 5-1 to 5-$n$ of the battery module M-2 as a determination voltage Vk. A voltage determinator A-3 one-to-one corresponds to a battery module M-3, and determines the inter-terminal voltage of the battery cells 5-1 to 5-$n$ of the battery module M-3 as a determination voltage Vk.

The voltage determinator A-1 outputs a digital value of the determined determination voltage Vk to the voltage determinator A-2 as determination data Dk. The voltage determinator A-2 outputs a digital value of the determined determination voltage Vk to the voltage determinator A-3 as determination data Dk. In addition, the voltage determinator A-2 transfers the determination data Dk input from the voltage determinator A-1 to the voltage determinator A-2.

The voltage determinator A-3 outputs a digital value of the determined determination voltage Vk to the battery controller S as determination data Dk. In addition, the voltage determinator A-2 transfers two pieces of determination data Dk input from the voltage determinator A-2 to the battery controller S. The two pieces of determination data Dk are determination data Dk of the digital value of the determination voltage Vk determined by the voltage determinator A-1 and determination data Dk of the digital value of the determination voltage Vk determined by the voltage determinator A-2.

As described above, the plurality of battery modules M are connected in series in an order of a battery module M-1, ..., a battery module M-(t−1), and a battery module M-t toward the negative electrode of the battery B from the positive electrode of the battery B. Then, a voltage determinator A-x ($2 \leq x \leq t$) acquires one or more pieces of determination data Dk from the voltage determinator on a high voltage side. The voltage determinator on a high voltage side of the voltage determinator A-x is a voltage determinator A-(x−1) one-to-one corresponding to a battery module M-(x−1) positioned on a positive electrode side of the battery B rather than a battery module M-x one-to-one corresponding to the voltage determinator A-x among t battery modules M.

Then, the voltage determinator A-x outputs the determination data Dk which is a digital value of the determined determination voltage Vk to the battery controller S or the voltage determinator on a low voltage side. In addition, the voltage determinator A-x transfers one or more pieces of determination data input from the voltage determinator on a high voltage side to the battery controller S or the voltage determinator on a low voltage side. The voltage determinator on a low voltage side of the voltage determinator A-x is a voltage determinator A-(x+1) one-to-one corresponding to a battery module M-(x+1) positioned on a negative electrode side of the battery B rather than the battery module M-x one-to-one corresponding to the voltage determinator A-x among t battery modules M.

Each voltage determinator A includes a voltage determination circuit 1, a first coupling capacitor 2a, a second coupling capacitor 2b, a first voltage divider circuit 3a, and a second voltage divider circuit 3b. The first voltage divider circuit 3a is an example of a "voltage generation circuit" of the present invention. The second voltage divider circuit 3b is an example of the "voltage generation circuit" of the present invention.

The battery control system 100 includes a plurality of voltage determinators A of a number the same as that of battery modules M. The plurality of voltage determinators A and the battery controller S mounted on a control board Ps are configured in separate bodies. For example, the plurality of voltage determinators A may be integrally mounted on one printed circuit board. The printed circuit board is a voltage determination board Pk.

The voltage determination circuit 1 is an integrated circuit with a basic function of determining the inter-terminal voltage of respective battery cells 5-1 to 5-$n$ and outputting a result to the second coupling capacitor 2b. The voltage determination circuit 1, as an additional function, relays determination data Dk input from a voltage determinator on a high voltage side and outputs it to the second coupling capacitor 2b via the first coupling capacitor 2a. In addition, the voltage determination circuit 1 outputs a first set voltage V1 input from the first voltage divider circuit 3a and a second set voltage V2 input from the second voltage divider circuit 3b to the second coupling capacitor 2b.

Figure 2:
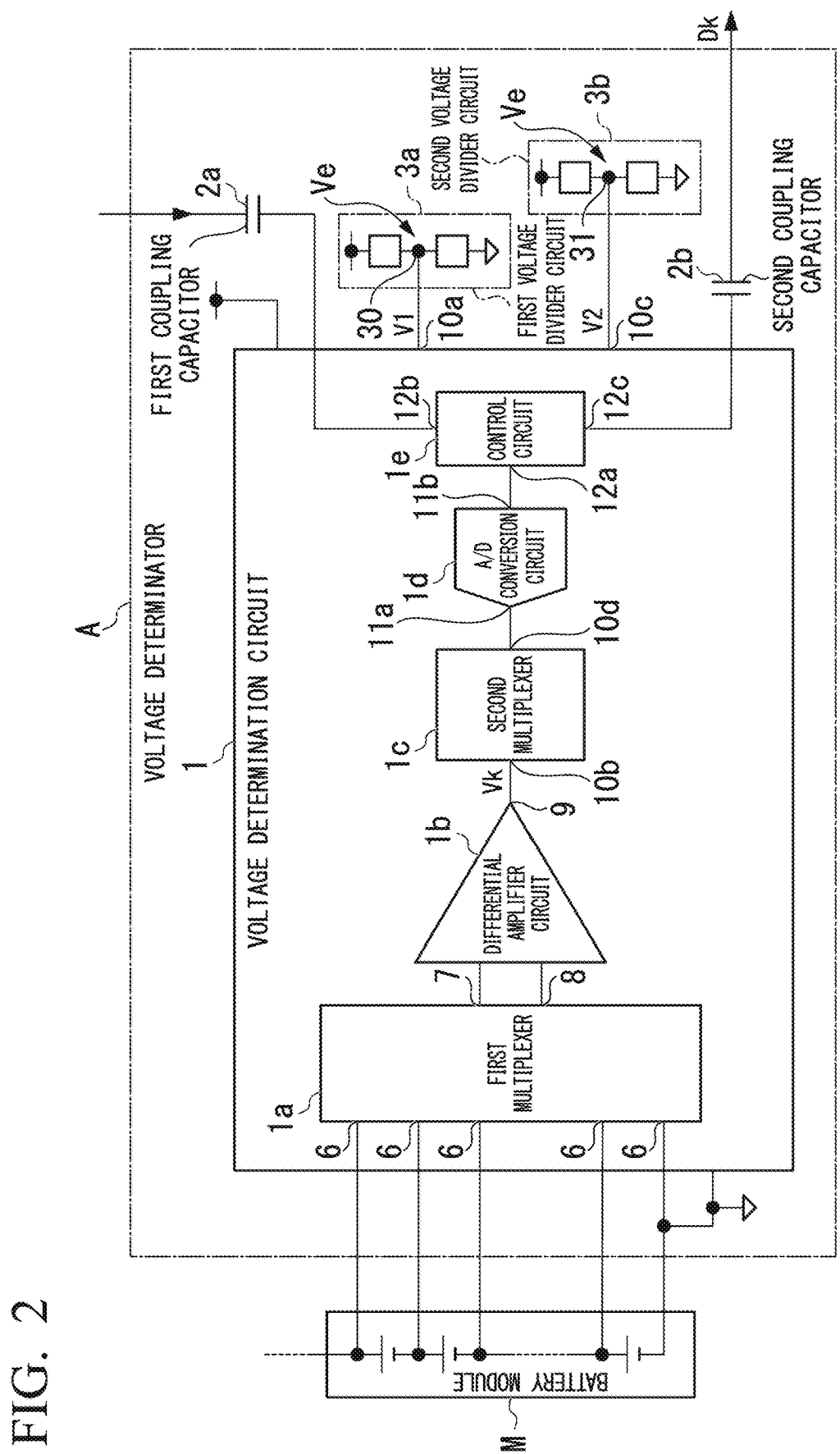
FIG. 2 is a circuit diagram of a voltage determinator according to the present embodiment.

As shown in FIG. 2, the voltage determination circuit 1 includes a first multiplexer 1a, a differential amplifier circuit 1b, a second multiplexer 1c, an A/D conversion circuit 1d, and a control circuit 1e. As shown in FIG. 2, the first multiplexer 1a includes a plurality of input terminals 6 and a pair of output terminals 7 and 8. The plurality of input terminals 6 are connected to electrodes of the plurality of battery cells 5-1 to 5-n, respectively. The first multiplexer 1a selects any one of the plurality of battery cells 5-1 to 5-n, and connects an electrode pair (a positive electrode and a negative electrode) of the selected battery cell 5 to the pair of output terminals 7 and 8.

For example, the first multiplexer 1a selects a battery cell 5 having the lowest potential among the plurality of battery cells 5-1 to 5-n of a battery module M one-to-one corresponding to the first multiplexer 1a. Then, the first multiplexer 1a connects the input terminal 6 connected to the positive electrode among the positive electrode and negative electrode of the selected battery cell 5 having the lowest potential to the output terminal 7, and connects the input terminal 6 connected to the negative electrode to an output terminal 8. The operation of the first multiplexer 1a selecting any one of the plurality of battery cells 5-1 to 5-n is controlled by the control circuit 1e.

The differential amplifier circuit 1b amplifies a difference between a voltage of the output terminal 7 of the first multiplexer 1a and a voltage of the output terminal 8 at a predetermined degree of amplification. The voltage of the output terminal 7 is a voltage of the positive electrode of the battery cell 5 selected by the first multiplexer 1a. The voltage of the output terminal 8 is a voltage of the negative electrode of the battery cell 5 selected by the first multiplexer 1a. The differential amplifier circuit 1b outputs a voltage obtained by multiplying the difference by the degree of amplification from the output terminal 9 as a determination voltage Vk. That is, the determination voltage Vk has a magnitude obtained by multiplying an inter-terminal voltage (cell voltage) of the battery cell 5 selected by the first multiplexer 1a by the amplification.

In addition, since a potential level of the first multiplexer 1a is different from a potential level of the second multiplexer 1c, the differential amplifier circuit 1b has a level conversion function of converting the potential level of the first multiplexer 1a into the potential level of the second multiplexer 1c and transmitting it to an electrical signal.

The second multiplexer 1c includes three input terminals 10a to 10c, and one output terminal 10d as shown in FIG. 3A-FIG. 3B. An input terminal 10a is connected to an output terminal 30 of the first voltage divider circuit 3a. The input terminal 10b is connected to the output terminal 9 of the differential amplifier circuit 1b. The input terminal 10c is connected to an output terminal 31 of the second voltage divider circuit 3b. The second multiplexer 1c alternatively selects one of the output terminal 9 of the differential amplifier circuit 1b, the output terminal 30 of the first voltage divider circuit 3a, and the output terminal 31 of the second voltage divider circuit 3b, and electrically connects the selected output terminal to the output terminal 10d. For example, the second multiplexer 1c electrically connects the output terminal 9 to the output terminal 10d by connecting the input terminal 10b and the output terminal 10d when the output terminal 9 of the differential amplifier circuit 1b is selected. That is, the second multiplexer 1c selects any one of the determination voltage Vk, the first set voltage V1, and the second set voltage V2, and outputs it to the A/D conversion circuit 1d. Note that the operation of the second multiplexer 1c alternatively selecting any one of the output terminal 9, the output terminal 30, and the output terminal 31 is controlled by the control circuit 1e. The determination voltage Vk, the first set voltage V1, and the second set voltage V2 are all analog signals.

The A/D conversion circuit 1d includes an input terminal 11a and an output terminal 11b. The input terminal 11a is connected to the output terminal 10d.

The A/D conversion circuit 1d converts the determination voltage Vk, the first set voltage V1, or the second set voltage V2 sequentially input from the second multiplexer 1c to the input terminal 11a into a digital value. The A/D conversion circuit 1d outputs voltage data of the converted digital value from the output terminal 11b to the control circuit 1e. For example, the A/D conversion circuit 1d outputs determination data Dk obtained by converting the determination voltage Vk into a digital value to the control circuit 1e. For example, the A/D conversion circuit 1d outputs first setting data D1 obtained by converting the first set voltage V1 into a digital value to the control circuit 1e. For example, the A/D conversion circuit 1d outputs second setting data D2 obtained by converting the second set voltage V2 into a digital value to the control circuit 1e. Note that the first setting data D1 and the second setting data D2 are characteristics signals in the present invention.

The first set voltage V1 and the second set voltage V2 are all DC voltages. The determination voltage Vk is a DC voltage which can change relatively slowly. The A/D conversion circuit 1d converts the DC voltage, which is an analog voltage, into voltage data of a digital value. The sampling rate and the number of bits of digital conversion are set to values corresponding to a DC voltage.

The control circuit 1e includes an input terminal 12a, an input terminal 12b, and an output terminal 12c. The input terminal 12a is connected to the output terminal 11b. The input terminal 12b is connected to a first end of the first coupling capacitor 2a. The output terminal 12c is connected to a second end of the second coupling capacitor 2b.

The control circuit 1e controls the selection operation of the first multiplexer 1a and the second multiplexer 1c. The control circuit 1e acquires the determination data Dk, the first setting data D1, and the second setting data D2 acquired from the A/D conversion circuit 1d. The control circuit 1e acquires the determination data Dk from a voltage determinator A on a high potential side. The control circuit 1e outputs the determination data Dk, the first setting data D1, and the second setting data D2 acquired from the A/D conversion circuit 1d, and various types of voltage data of the determination data Dk acquired from a voltage determinator A on a high potential side to the second coupling capacitor 2b in a predetermined order and timing. That is, the control circuit 1e transfers the various types of voltage data to the battery controller S via the second coupling capacitor 2b on the basis of a transfer condition set in advance.

The first coupling capacitor 2a has a first end connected to the input terminal 12b and a second end connected to a first end of the second coupling capacitor 2b of the voltage determinator A on a high voltage side. The first end of the second coupling capacitor 2b is connected to the second end of the first coupling capacitor 2a of a voltage determinator A on a low voltage side or an input terminal of the battery controller S. The second end of the second coupling capacitor 2b is connected to the output terminal 12c of the control circuit 1e of voltage determinator A including this second coupling capacitor 2b. The first and second coupling capacitors 2a and 2b are coupling capacitors which connect the voltage determinator A on a high voltage side for a certain voltage determinator A and the voltage determinator A on a low voltage side for the voltage determinator A in an alternating manner. Alternatively, the first and second coupling capacitors 2a and 2b are coupling capacitors which connect a certain voltage determinator A and the battery controller S in an alternating manner.

The first voltage divider circuit 3a includes a pair of resistors connected in series. The first voltage divider circuit 3a has a first end connected to a DC power supply and a second end connected to a GND. The GND is a ground potential of each voltage determinator A. The first voltage divider circuit 3a divides a power supply voltage Ve (for example, 5V) by resistance of the pair of resistors, and outputs the divided voltage from the output terminal 30 to the voltage determination circuit 1 as the first set voltage V1. The output terminal 30 is electrically connected to a connection point of the pair of resistors as shown in FIG. 2.

The first set voltage V1 which is an output voltage of the first voltage divider circuit 3a is a voltage which indicates a gain correction value of the voltage determination circuit 1. The gain correction value is a correction value obtained by correcting a gain error of the differential amplifier circuit 1b included in the determination data Dk. For example, the gain correction value is a value which indicates the gain error of the differential amplifier circuit 1b. The first set voltage V1 is, as shown in FIG. 3A, a voltage value between 0 to Ve (for example, 5V) corresponding to any one of gain correction values of 1.50000 to 0.50000 set at a predetermined pitch width (predetermined resolution).

The second voltage divider circuit 3b includes a pair of resistors connected in series. The second voltage divider circuit 3b has a first end connected to the DC power supply and a second end connected to the GND. The second voltage divider circuit 3b outputs a voltage obtained by dividing the power supply voltage Ve (for example, 5V) by the resistance of the pair of resistors as the second voltage V2 from the output terminal 31 to the voltage determination circuit 1. The output terminal 31 of the second voltage divider circuit 3b is electrically connected to the connection point of the pair of resistors as shown in FIG. 2.

The second set voltage V2 which is an output voltage of the second voltage divider circuit 3b is a voltage indicating an offset correction value of the voltage determination circuit 1 described above. An offset correction value is a correction value obtained by correcting an offset error of the voltage determination circuit 1 included in the determination data Dk. For example, the offset correction value is an offset voltage of the differential amplifier circuit 1b. The second set voltage V2 is, as shown in FIG. 3B, a voltage value between 0 to Ve (5V) corresponding to any one of offset correction values of 5.0000 to −5.0000 set at a predetermined pitch width (predetermined resolution).

The battery controller S is provided in a separate body from the plurality of voltage determinators A described above. The battery controller S controls the charging or discharging of the battery B on the basis of the determination data Dk, the first setting data D1, and the second setting data D2 received from the voltage determinator A. That is, the battery controller S corrects an error of the determination data Dk by using the first setting data D1 and the second setting data D2. Then, the battery controller S controls the charging or discharging of the battery B on the basis of the determination data Dk after the error is corrected.

The battery controller S includes a voltage correction unit H. The voltage correction unit H corrects a determination error included in the determination data Dk of each voltage determinator A by using the gain correction value and the offset correction value of the voltage determination circuit 1 of each voltage determinator A indicated by the first setting data D1 and the second setting data D2. The determination error is a gain error and an offset error.

Next, an operation of the battery control system 100 will be described in detail with reference to FIG. 4 in addition to FIG. 1 to FIG. 3A-FIG. 3B.

Figure 4:
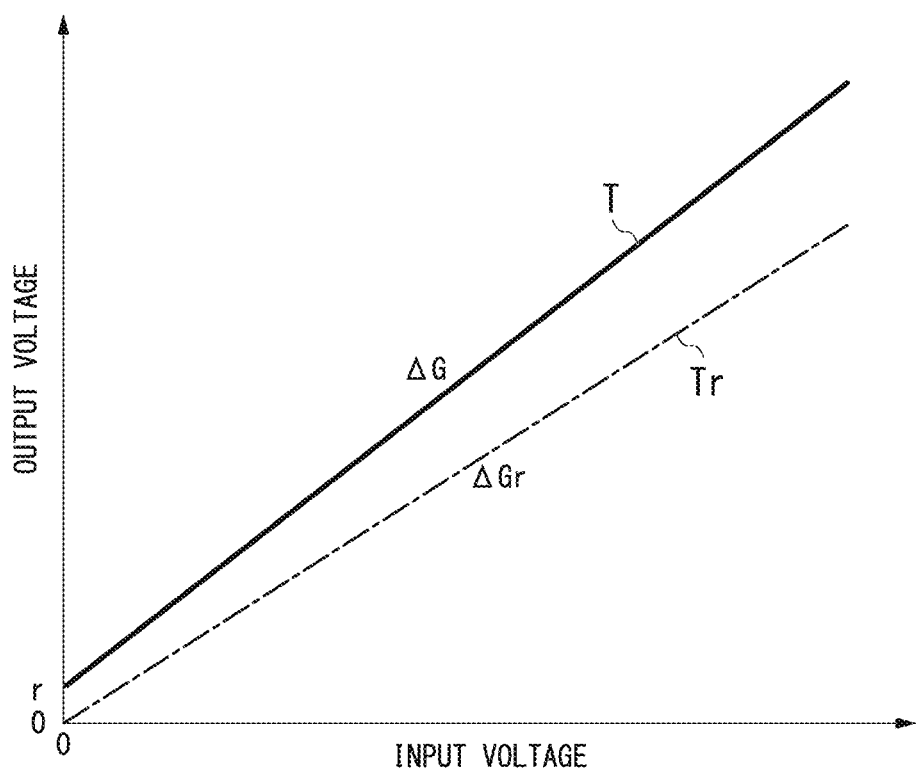
FIG. 4 is a schematic diagram which shows a correction operation of the battery control system 100 according to the present embodiment.

An output voltage shown in FIG. 4 is a determination voltage Vk of the voltage determinator A. An input voltage shown in FIG. 4 is the inter-terminal voltage of the battery cell 5 which is input to the voltage determination circuit 1.

The voltage determination circuit 1 of each voltage determinator A has second input/output characteristics T having an error with respect to an ideal or standard first input/output characteristics Tr as shown in FIG. 4. Error factors of the second input/output characteristics T in the voltage determination circuit 1 are a gain error and an offset error. A gain of the voltage determination circuit 1 having the first input/output characteristics Tr is constant regardless of a magnitude of an input voltage which is a cell voltage input from the battery module M. However, an actual voltage determination circuit 1 has the second input/output characteristics T instead of the first input/output characteristics Tr. Therefore, the gain of the actual voltage determination circuit 1 changes in accordance with the magnitude of the input voltage. An amount of the change is a gain error. In addition, the voltage determination circuit 1 having the first input/output characteristics Tr has an output of "zero" when the input is "zero." However, the actual voltage determination circuit 1 having the second input/output characteristics T has an output of a value r instead of "zero" when the input is "zero." This value r is an offset error.

The determination voltage Vk of each voltage determinator A includes the gain error and the offset error described above. Therefore, when the voltage determinator A acquires the inter-terminal voltage of each battery cell 5 more accurately, it is necessary to correct the gain error and the offset error included in the determination voltage Vk.

Under such circumstances, in the battery control system 100 according to the present embodiment, each voltage determinator A transfers the gain of the voltage determination circuit 1 to the battery controller S as the first set voltage V1. In addition, each voltage determinator A transfers the offset of the voltage determination circuit 1 to the battery controller S as the second set voltage V2.

Then, the voltage correction unit H of the battery controller S identifies a gain correction value of the voltage determination circuit 1 by referring to a first conversion table shown in FIG. 3A using the first set voltage V1 received from each voltage determinator A. In addition, the voltage correction unit H identifies an offset correction value of the voltage determination circuit 1 by referring to a second conversion table shown in FIG. 3B using the second set voltage V2 received from each voltage determinator A. The voltage correction unit H includes the first conversion table and the second conversion table.

The voltage correction unit H calculates the determination voltage Vk in the first input/output characteristics Tr on the basis of the identified gain correction value and offset correction value of the differential amplifier circuit 1b and the determination data Dk received from each voltage determinator A. In the following description, the determination voltage Vk in the first input/output characteristics Tr is referred to as a corrected determination voltage Vk'. For example, the voltage correction unit H identifies a gain correction value and an offset voltage correction value using the first set voltage V1 and the second set voltage V2. The voltage correction unit H identifies an inter-terminal voltage (input voltage) corresponding to the determination voltage Vk (determination data Dk) which is a value on the second input/output characteristics T received from the voltage determinator A using the identified gain correction value and offset voltage correction value. The voltage correction unit H obtains a value of an output voltage on the first input/output characteristics Tr corresponding to the identified inter-terminal voltage as the corrected determination voltage Vk'. In this manner, the voltage correction unit H obtains the corrected determination voltage Vk' by correcting the determination voltage Vk using the gain correction value and the offset voltage correction value to remove a gain error and an offset error included in the determination voltage Vk (determination data Dk).

According to the present embodiment, when the plurality of voltage determinators A and the battery controller S are separate bodies, the battery controller S corrects the gain error and the offset error included in the determination voltage Vk of each voltage determinator A and acquires the corrected determination voltage Vk' which does not include the gain error and the offset error. Therefore, according to the present embodiment, even when the plurality of voltage determinators A and the battery controller S are separate bodies, the battery controller S can acquire an accurate cell voltage. Therefore, the battery controller S can realize accurate control for the battery B.

Here, the first set voltage V1 and the second set voltage V2 in each voltage determinator A may also be transferred from each voltage determinator A to the battery controller S when the battery control system 100 is initially operated. Then, the voltage correction unit H of the battery controller S acquires the gain correction value and offset correction value of the voltage determination circuit 1 in each voltage determinator A by referring to the first conversion table and the second conversion table using the acquired first set voltage V1 and second set voltage V2. Then, the voltage correction unit H stores the gain correction value and the offset correction value of each voltage determination circuit 1 in an internal memory. The voltage correction unit H sequentially acquires the corrected determination voltage Vk' by performing correction processing based on the gain correction value and the offset correction value stored in the internal memory on the determination data Dk sequentially transferred from the voltage determinator A.

Note that the present invention is not limited to the embodiments described above, and, for example, modification examples like the following (a) to (d) can be considered.

(a) The battery control system 100 of the embodiment described above has corrected both the gain error and the offset error by transferring the first set voltage V1 and the second set voltage V2 from each voltage determinator A to the battery controller S. However, the battery control system 100 may also correct one of the gain error and the offset error by transferring any one of the first set voltage V1 and the second set voltage V2 instead of both the first set voltage V1 and the second set voltage V2, to the battery controller S. The characteristics signal may be both the first set voltage V1 and the second set voltage V2, and may also be one of the first set voltage V1 and the second set voltage V2.

(b) In the embodiment described above, the voltage determinator A has generated the first set voltage V1 and the second set voltage V2 by dividing a power supply voltage Ve using the first voltage divider circuit 3a and the second voltage divider circuit 3b, but the present invention is not limited thereto. The power supply determinator A may generate the first set voltage V1 and the second set voltage V2 by dividing an output of a reference power supply circuit whose voltage stability is excellent to eliminate an influence of fluctuations in the power supply voltage Ve. In addition, the voltage determinator A may use a constant voltage diode which provides various output voltages instead of the first and second voltage divider circuits 3a and 3b.

(c) In the embodiment described above, the voltage determinator A transfers the first set voltage V1 and the second set voltage V2 of a voltage determinator A on a high voltage side to the battery controller S via a voltage determinator A on a low voltage side, but the present invention is not limited thereto. For example, each voltage determinator A may directly transfer the first set voltage V1 and the second set voltage V2 to the battery controller S.

(d) The corrector of the embodiment described above is not limited to the battery controller S, and each voltage determinator A may be an apparatus other than the battery controller S as long as it is an apparatus in a separate body.

According to the voltage determinator described above, when a voltage determinator and a corrector are provided in separate bodies, it is possible to correct a determination voltage of the voltage determinator.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

A Voltage determinator
B Battery
H Voltage correction unit
M Battery module
Pk Voltage determination board
Ps Control board
S Battery controller
1 Voltage determination circuit
1a First multiplexer
1b differential amplifier circuit
1c Second multiplexer
1d A/D conversion circuit
1e Control circuit
2a First coupling capacitor
2b Second coupling capacitor
3a First voltage divider circuit
3b Second voltage divider circuit
100 Battery control system

What is claimed is:
1. A voltage determinator comprising:
a voltage determination circuit configured to determine each inter-terminal voltage of a plurality of battery cells configuring a battery, and output a voltage obtained by amplifying the each determined inter-terminal voltage to a corrector in a separate body as a determination voltage; and
a coupler configured to connect the corrector and the voltage determination circuit in an alternating manner,
wherein the voltage determination circuit includes:
a voltage divider circuit configured to generate a DC voltage by dividing a predetermined voltage, the DC voltage indicating characteristics of the voltage determination circuit; and an A/D conversion circuit configured to generate a digital signal of the DC voltage as a characteristics signal by performing an A/D conversion on the DC voltage, wherein the voltage determination circuit is configured to output a set voltage input from the voltage divider circuit to the coupler, and the voltage determination circuit is configured to output the characteristics signal indicating characteristics of the voltage determination circuit to the corrector, wherein the characteristics signal is based on the set voltage.

2. The voltage determinator according to claim 1, wherein the characteristics of the voltage determination circuit are at least one of an offset error of the voltage determination circuit and a gain error of the voltage determination circuit.

3. The voltage determinator according to claim 1, wherein the battery includes a plurality of battery modules, each of the battery modules includes the plurality of battery cells, and a plurality of the voltage determination circuits are provided in a one-to-one correspondence with each of the plurality of battery modules in the voltage determinator.

4. The voltage determinator according to claim 3, wherein the characteristics of the voltage determination circuit are at least one of an offset error of the voltage determination circuit and a gain error of the voltage determination circuit.

5. A voltage determination system comprising:
the voltage determinator according to claim 1; and
the corrector,
wherein the corrector corrects the determination voltage on the basis of the characteristics signal input from the voltage determinator.

6. The voltage determination system according to claim 5, wherein the characteristics of the voltage determination circuit are at least one of an offset error of the voltage determination circuit and a gain error of the voltage determination circuit.

7. The voltage determination system according to claim 6, wherein the battery includes a plurality of battery modules, each of the battery modules includes the plurality of battery cells, and a plurality of the voltage determination circuits are provided in a one-to-one correspondence with each of the plurality of battery modules in the voltage determinator.

8. The voltage determination system according to claim 5, wherein the battery includes a plurality of battery modules, each of the battery modules includes the plurality of battery cells, and a plurality of the voltage determination circuits are provided in a one-to-one correspondence with each of the plurality of battery modules in the voltage determinator.

9. The voltage determination system according to claim 1, wherein the coupler is a coupling capacitor.

* * * * *